US012813355B2

(12) United States Patent
Kakefu et al.

(10) Patent No.: US 12,813,355 B2
(45) Date of Patent: Nov. 24, 2026

(54) SEMICONDUCTOR DEVICE

(71) Applicant: FUJI ELECTRIC CO., LTD., Kawasaki (JP)

(72) Inventors: Mitsuhiro Kakefu, Matsumoto-city (JP); Hiroaki Ichikawa, Azumino-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 199 days.

(21) Appl. No.: 18/734,915

(22) Filed: Jun. 5, 2024

(65) Prior Publication Data

US 2024/0321834 A1 Sep. 26, 2024

Related U.S. Application Data

(63) Continuation of application No. 18/316,783, filed on May 12, 2023, now Pat. No. 12,033,984, which is a (Continued)

(30) Foreign Application Priority Data

Sep. 20, 2018 (JP) ................................ 2018-175498

(51) Int. Cl.

*H10W 90/00* (2026.01)
*H10D 8/00* (2025.01)
(Continued)

(52) U.S. Cl.

CPC .............. *H10W 90/00* (2026.01); *H10D 8/00* (2025.01); *H10D 12/411* (2025.01); *H10W 70/658* (2026.01); *H10W 90/754* (2026.01)

(58) Field of Classification Search

CPC ............. H10W 72/073; H10W 72/534; H10W 72/07336; H10W 72/075; H10W 72/30;
(Continued)

(56) References Cited

U.S. PATENT DOCUMENTS 5,170,337 A 12/1992 Borowiec et al.
11,063,025 B2 7/2021 Nakashima et al.
(Continued)

FOREIGN PATENT DOCUMENTS

CN 108140640 A 6/2018
DE 10037533 C1 1/2002
(Continued)

OTHER PUBLICATIONS

Chinese Office Action dated Feb. 27, 2024, in the counterpart Chinese Patent Application No. 201980016244.X.
(Continued)

*Primary Examiner* — Marc-Anthony Armand
(74) *Attorney, Agent, or Firm* — Rabin & Berdo, P.C.

(57) ABSTRACT

A semiconductor device having a semiconductor unit including: a first arm part that includes first and second semiconductor chips respectively having first and second main electrodes, a first circuit pattern on which the first and second semiconductor chips are disposed, a second circuit pattern, a first main current wire connecting the first main electrode and second circuit pattern, and a second main current wire connecting the second main electrode and the second circuit pattern; and a second arm part that includes third and fourth semiconductor chips respectively having third and fourth main electrodes and being disposed on the second circuit pattern, a third circuit pattern, a third main current wire connecting the third main electrode and the third circuit pattern, and a fourth main current wire connecting the fourth main electrode and the third circuit pattern. Each semiconductor chip is an IGBT or MOSFET.

20 Claims, 8 Drawing Sheets

Related U.S. Application Data continuation of application No. 17/153,957, filed on Jan. 21, 2021, now Pat. No. 11,688,722, which is a continuation-in-part of application No. 17/004,372, filed on Aug. 27, 2020, now Pat. No. 11,515,292, which is a continuation of application No. PCT/JP2019/028851, filed on Jul. 23, 2019.

(51) Int. Cl.
*H10D 12/00* (2025.01)
*H10W 70/65* (2026.01)

(58) Field of Classification Search
CPC ........... H10W 72/352; H10W 72/5438; H10W 72/5445; H10W 72/5524; H10W 72/5525; H10W 72/884; H10W 70/611; H10W 70/65; H10W 40/255; H10W 72/926; H10W 90/753; H10D 30/60; H02M 1/32; H02M 7/003; H02M 7/5387
See application file for complete search history.

(56) References Cited

U.S. PATENT DOCUMENTS

| | | | | |
|---|---|---|---|---|
| 11,515,292 | B2 | 11/2022 | Kakefu et al. | |
| 11,688,722 | B2 | 6/2023 | Kakefu et al. | |
| 2002/0018353 | A1 | 2/2002 | Mourick | |
| 2010/0052140 | A1* | 3/2010 | Kuan | H10W 70/442 257/676 |
| 2017/0271275 | A1 | 9/2017 | Inaba | |
| 2017/0287828 | A1* | 10/2017 | Sawada | H10W 44/401 |
| 2018/0204778 | A1 | 7/2018 | Hasegawa et al. | |
| 2019/0052189 | A1 | 2/2019 | Oomori | |
| 2019/0139880 | A1 | 5/2019 | Jakobi et al. | |

FOREIGN PATENT DOCUMENTS

| | | | |
|---|---|---|---|
| DE | 102004027186 | B3 | 10/2005 |
| DE | 102017203024 | A1 | 9/2017 |
| DE | 112015006984 | T5 | 7/2018 |
| JP | 2004-363339 | A | 12/2004 |
| JP | 2009-164325 | A | 7/2009 |
| JP | 2017-168792 | A | 9/2017 |
| JP | 2018-186302 | A | 11/2018 |
| WO | 2015176985 | A1 | 11/2015 |
| WO | 2017/056176 | A1 | 4/2017 |
| WO | 2017/159029 | A1 | 9/2017 |
| WO | 2019/044748 | A1 | 3/2019 |

OTHER PUBLICATIONS

International Search Report for PCT/JP2019/028851, mailed on Oct. 21, 2019.
W. Jakobi et al., "Benefits of new CoolSiC TM Mosfet in HybridPACK TM Drive package for eletrical drive train applications.", CIPS 2018, pp. 585-593.
Written Opinion for PCT/JP2019/028851, mailed on Oct. 21, 2019.
Office Action issued for corresponding German Patent Application No. 11 2019 000 595.2, and its English translation, dated Sep. 10, 2026.

* cited by examiner

SEMICONDUCTOR DEVICE

CROSS-REFERENCE TO RELATED APPLICATIONS

This is a continuation application of U.S. application Ser. No. 18/316,783 filed on May 12, 2023, which is a continuation application of U.S. application Ser. No. 17/153,957 filed on Jan. 21, 2021 (now U.S. Pat. No. 11,688,722), which is a continuation-in-part of patent application Ser. No. 17/004,372 filed on Aug. 27, 2020 (now U.S. Pat. No. 11,515,292), which is a continuation application of International Application PCT/JP2019/028851 filed on Jul. 23, 2019 which designated the U.S., which claims priority to Japanese Patent Application No. 2018-175498 filed on Sep. 20, 2018, the entire contents of which are incorporated herein by reference.

BACKGROUND OF THE INVENTION

1. Field of the Invention

The embodiments discussed herein relate to a semiconductor device.

2. Background of the Related Art

Semiconductor devices include, for example, semiconductor elements such as IGBTs (insulated gate bipolar transistors) and power MOSFETs (metal oxide semiconductor field effect transistors). Such a semiconductor device, having a plurality of semiconductor units including the above semiconductor elements on a heat dissipation plate, is able to implement desired functions (for example, see Japanese Laid-open Patent Publication No. 2004-363339).

As an example of such a semiconductor unit, an RC (reverse-conducting)-IGBT chip that integrates IGBT and FWD (freewheeling diode) on a single chip is disposed on a circuit pattern. A semiconductor device in which a plurality of such semiconductor units are disposed on a heat dissipation plate and electrically connected to each other is used as a power conversion device.

For semiconductor devices, downsizing, high-current capability, and low loss are demanded. For downsizing and high-current capability, a plurality of semiconductor chips needs to be disposed on a circuit pattern with high area efficiency. Meanwhile, in order not to increase loss, a decrease in gate response speed needs to be prevented. However, in view of both the high area efficiency and the prevention of the decrease in gate response speed, it has not been said that the arrangement of circuit patterns, semiconductor chips, and wires in a semiconductor device is optimal.

SUMMARY OF THE INVENTION

According to an aspect, there is provided a semiconductor device, including a semiconductor unit, including: a first arm part that includes a first semiconductor chip having a first main electrode, a second semiconductor chip having a second main electrode, a first circuit pattern on which the first semiconductor chip and the second semiconductor chip are disposed, a second circuit pattern to which the first main electrode and the second main electrode are connected, a first main current wire extending in a first direction and connecting a plurality of points of the first main electrode, and the second circuit pattern, by stitch bonding, and a second main current wire extending in the first direction and connecting a plurality of points of the second main electrode, and the second circuit pattern, by the stitch bonding; and a second arm part that includes a third semiconductor chip having a third main electrode and being disposed on the second circuit pattern, a fourth semiconductor chip having a fourth main electrode and being disposed on the second circuit pattern, a third circuit pattern to which the third main electrode and the fourth main electrode are connected, a third main current wire extending in the first direction and connecting a plurality of points of the third main electrode, and the third circuit pattern, by the stitch bonding, and a fourth main current wire extending in the first direction and connecting a plurality of points of the fourth main electrode, and the third circuit pattern, by the stitch bonding, wherein each of the first to fourth semiconductor chips is an insulated gate bipolar transistor (IGBT) or a metal-oxide-semiconductor field-effect transistor (MOSFET) that has a diode region functioning as a diode.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

First Embodiment

Figure 1A:
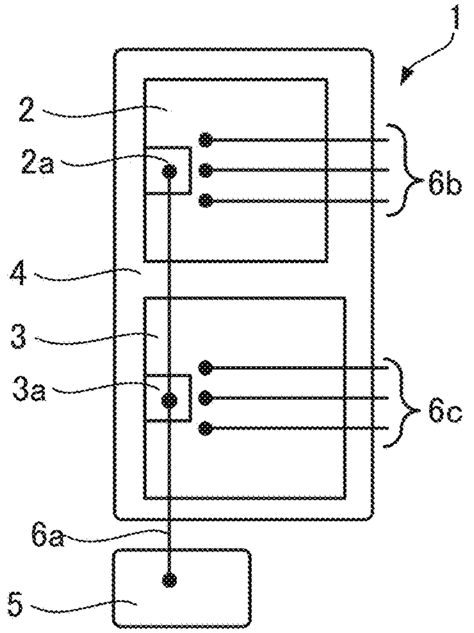
FIGS. 1A to 1D are views for explaining arm parts individually included in a semiconductor device according to a first embodiment.
Figure 1B:
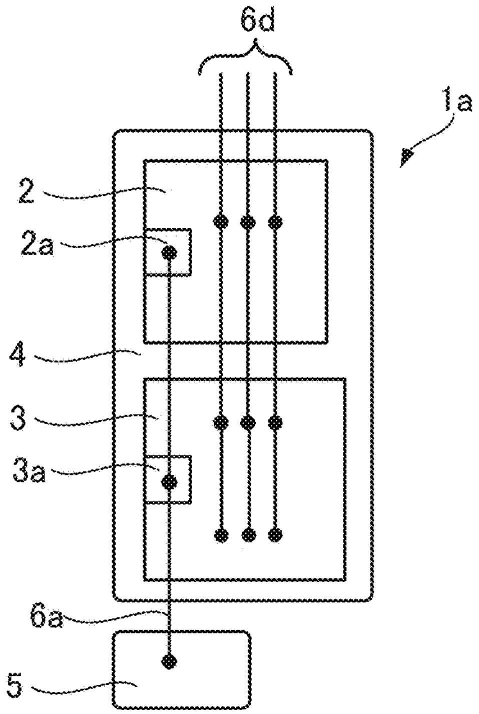
Figure 1C:
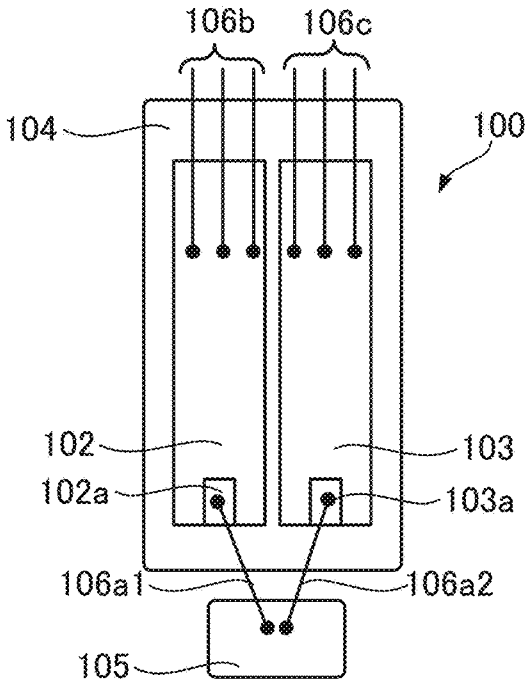
Figure 1D:
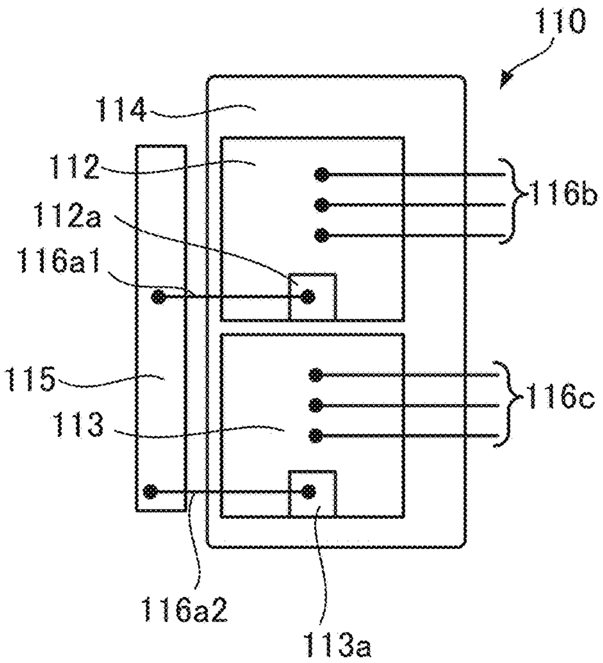

The following describes, with reference to the accompanying drawings, arm parts individually included in a semiconductor device according to a first embodiment with reference to FIGS. 1A to 1D. FIGS. 1A to 1D are views for explaining arm parts individually included in a semiconductor device according to the first embodiment. In this connection, FIGS. 1A and 1B illustrate arm parts 1 and 1*a* individually included in a semiconductor device according to the first embodiment, whereas FIGS. 1C and 1D illustrate arm parts 100 and 110 individually included in a semiconductor device for reference examples.

The semiconductor device of the first embodiment includes the arm part 1 illustrated in FIG. 1A. The arm part 1 includes semiconductor chips 2 and 3, circuit patterns 4 and 5, and a control wire 6*a*. The semiconductor chip 2 has a control electrode 2*a* at a side portion of its front surface, and the semiconductor chip 3 has a control electrode 3*a* at a side portion of its front surface. For example, the semiconductor chips 2 and 3 include switching elements such as IGBTs and power MOSFETs, for example. Such semiconductor chips 2 and 3 each have an input electrode (drain electrode or collector electrode) serving as a main electrode on its rear surface, and a control electrode (gate electrode) and an output electrode (source electrode or emitter electrode) serving as a main electrode on its front surface, for example. In addition, the semiconductor chips 2 and 3 include diodes such as SBDs (Schottky barrier diodes) and FWDs, as needed. Such semiconductor chips 2 and 3 each have an output electrode (cathode electrode) serving as a main electrode on its rear surface and an input electrode (anode electrode) serving as a main electrode on its front surface. In addition, the semiconductor chips 2 and 3 may include an RC-IGBT that integrates the IGBT and FWD functions into a single chip. For example, the circuit pattern 4 is rectangular in plan view, and the semiconductor chips 2 and 3 are disposed on the circuit pattern 4 such that side portions of the semiconductor chips 2 and 3 are aligned in a line and the control electrodes 2*a* and 3*a* are aligned in a line. The circuit pattern 5 is rectangular in plan view and is aligned in a line with the control electrodes 2*a* and 3*a*. The control wire 6*a* electrically connects the control electrodes 2*a* and 3*a* and the circuit pattern 5. In the arm part 1 illustrated in FIG. 1A, main current wires 6*b* and 6*c* are respectively connected to the main electrodes of the semiconductor chips 2 and 3 in a direction perpendicular to the connection direction of the control wire 6*a*. The connection direction is a direction in which the control wire extends from one end to the other end thereof. In this connection, the term "perpendicular" direction here refers to any direction at an angle of ±30° to a direction orthogonal to the connection direction of the control wire 6*a*. In addition, each of the control wire 6*a* and main current wires 6*b* and 6*c* may be formed using a bonding wire, a lead frame, a ribbon conductor member, or another.

The semiconductor device of the first embodiment may include an arm part 1*a* illustrated in FIG. 1B, in place of the arm part 1. In this connection, in the arm part 1*a*, elements equivalent to those in the arm part 1 are designated by the same reference numerals as used in the arm part 1. In this arm part 1*a*, main current wires 6*d* are connected to the main electrodes of semiconductor chips 2 and 3 in a direction anti-parallel to the connection direction of a control wire 6*a*. Here, the term "anti-parallel" means that while the two directions are parallel to each other, they run in opposite directions. The term "parallel" direction refers to any direction at an angle of ±30° to a direction parallel to the connection direction of the control wire 6*a*. In addition, each of the control wire 6*a* and main current wires 6*d* may be formed using a bonding wire, a lead frame, a ribbon conductor member, or another.

The following describes reference examples for the above arm part 1. The arm part 100 illustrated in FIG. 1C includes semiconductor chips 102 and 103, circuit patterns 104 and 105, and control wires 106*a*1 and 106*a*2. For example, the semiconductor chips 102 and 103 are RC-IGBT chips and are vertically long in plan view. The semiconductor chip 102 has a control electrode 102*a* at the lower portion of its front surface and the semiconductor chip 103 has a control electrode 103*a* at the lower portion of its front surface as seen in FIG. 1C. The circuit pattern 104 is rectangular in plan view, and the semiconductor chips 102 and 103 are disposed such that the control electrodes 102*a* and 103*a* are aligned in a line. The circuit pattern 105 is disposed on the side of the circuit pattern 104 where the control electrodes 102*a* and 103*a* are located and apart from the circuit pattern 104. In addition, the control wire 106*al* electrically connects the control electrode 102*a* and the circuit pattern 105, and the control wire 106*a*2 electrically connects the control electrode 103*a* and the circuit pattern 105. In addition, in the arm part 100, main current wires 106*b* and 106*c* are respectively connected to the upper portion of the main electrodes of the semiconductor chips 102 and 103 as seen in FIG. 1C. Such an arm part 100 is able to make the most of the chip mounting area of the circuit pattern 104 for the semiconductor chips 102 and 103 and to thereby achieve high output current. However, since the semiconductor chips 102 and 103 are vertically long, a current, which flows along such a shape inside the semiconductor chips 102 and 103, has a long current path, which decreases the gate response speed. Therefore, the arm part 100 has a slow gate response speed, as compared with the arm part 1.

The arm part 110 illustrated in FIG. 1D includes semiconductor chips 112 and 113, circuit patterns 114 and 115, and control wires 116*a*1 and 116*a*2. The semiconductor chips 112 and 113 are RC-IGBT chips, for example, and are approximately square in plan view. The semiconductor chip 112 has a control electrode 112*a* at the lower portion of its front surface and the semiconductor chip 113 has a control electrode 113*a* at the lower portion of its front surface as seen in FIG. 1D. The circuit pattern 114 is rectangular in plan view, and the semiconductor chips 112 and 113 are vertically disposed such that the control electrodes 112*a* and 113*a* are located at the respective lower portions of the semiconductor chips 112 and 113 as seen in FIG. 1D. The control wires 116*a*1 and 116*a*2 extend from the control electrodes 112*a* and 113*a* to the left, as seen in FIG. 1D, according to the locations of the semiconductor chips 112 and 113. In addition, in the arm part 110, main current wires 116*b* and 116*c* are respectively connected to the right portions of the main electrodes of the semiconductor chips 112 and 113 as seen in FIG. 1D. The circuit pattern 115 is rectangular in plan view, is disposed on the left side of the circuit pattern 114 as seen in FIG. 1D, and is connected to the control wires 116*a*1 and 116*a*2. In such an arm part 110, since the semiconductor chips 112 and 113 are approximately square, a current, which flows along such a shape inside the semiconductor chips 112 and 113, has a current path shorter than that of the arm part 100, so that the decrease in gate response speed is prevented. However, the semiconductor chips 112 and 113 occupy a large part of the area of the circuit pattern 114 because of their shapes. Thus, it is not possible to make the most use of the chip mounting area. Therefore, the chip mounting area of the circuit pattern 114 is reduced, as compared with the arm part 1. In addition, in the case where three or more semiconductor chips are disposed vertically, the circuit pattern 115 connected to the control wires 116*al* and 116*a*2 is made vertically longer, which occupies a larger area.

As described above, the above semiconductor device includes the arm part 1 or 1*a*. The arm parts 1 and 1*a* each include the semiconductor chips 2 and 3, circuit patterns 4 and 5, and control wire 6*a*. The semiconductor chip 2 has the control electrode 2*a* at a side portion of its front surface, and the semiconductor chip 3 has the control electrode 3*a* at a side portion of its front surface. The circuit pattern 4 is rectangular in plan view, and the semiconductor chips 2 and 3 are disposed on the circuit pattern 4 such that the side portions of the semiconductor chips 2 and 3 are aligned in a line and the control electrodes 2*a* and 3*a* are aligned in a line. The circuit pattern 5 is aligned in a line with the control electrodes 2*a* and 3*a*. In addition, the control wire 6*a* electrically connects the control electrodes 2*a* and 3*a* and the circuit pattern 5. With the above arrangement, the arm parts 1 and 1*a* are able to prevent a decrease in gate response speed and also to reduce the possibility of non-uniform current generation. Further, it is possible to minimize an increase in temperature when a current flows and also to prevent concentration of heat generation. Still further, it is possible to make the most of the chip mounting area of the circuit pattern 4 for the semiconductor chips 2 and 3 and to thereby increase output current. As a result, a semiconductor device including such an arm part 1 or 1*a* exhibits improved characteristics.

Second Embodiment

Figure 2:
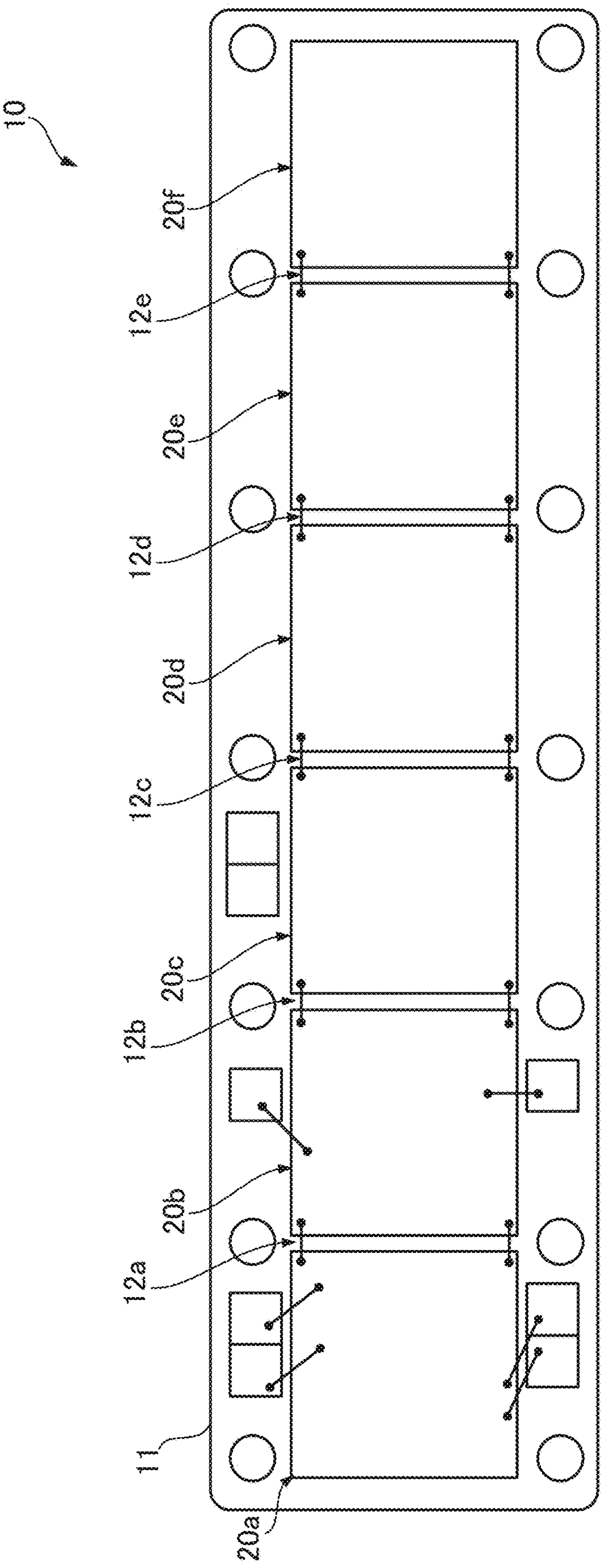
FIG. 2 is a plan view of a semiconductor device according to a second embodiment.

In a second embodiment, the first embodiment will be described more concretely. First, a semiconductor device will be described with reference to FIG. 2. FIG. 2 is a plan view of a semiconductor device according to the second embodiment. The semiconductor device 10 includes a heat dissipation substrate 11 and semiconductor units 20*a* to 20*f* electrically connected to each other with bonding wires 12*a* to 12*e*. The heat dissipation substrate 11 may be made of aluminum, iron, silver, copper, or an alloy containing at least one of these, which has superior thermal conductivity, for example. In addition, to improve corrosion resistance, for example, plating may be performed on the surface of the heat dissipation substrate 11 using a material such as nickel. Specific examples of the material include, other than nickel, a nickel-phosphorus alloy, a nickel-boron alloy, and others. In such a heat dissipation substrate 11, fixing holes for fixing to an external device, contact regions for allowing current to flow to/from the semiconductor units 20*a* to 20*f*, and others are formed, where appropriate. The semiconductor units 20*a* to 20*f* are disposed in a line in a prescribed direction on the front surface of the heat dissipation substrate 11 via solder, silver solder, or the like, for example. On these semiconductor units 20*a* to 20*f*, semiconductor chips including prescribed semiconductor elements are disposed so as to implement desired functions. In this connection, the number of semiconductor units 20*a* to 20*f* illustrated in FIG. 2 is just an example, and a desired number of semiconductor units may be disposed. In addition, in the following description, the semiconductor units 20*a* to 20*f* are collectively referred to as a semiconductor unit 20, which will be described in detail later. The bonding wires 12*a* to 12*e* are made of metal, such as aluminum or copper, or an alloy containing at least one of these, which has superior electrical conductivity.

In addition, to improve heat dissipation, a cooling unit (not illustrated) may be attached to the rear surface of the heat dissipation substrate 11 of the semiconductor device 10 using thermal grease containing a filler of metal oxide, such as silicone. The cooling unit in this case may be made of aluminum, iron, silver, copper, or an alloy containing at least one of these, which has superior thermal conductivity, for example. As the cooling unit, a fin, a heat sink with a plurality of fins, or a cooling device employing water cooling may be used. The heat dissipation substrate 11 may be formed integrally with such a cooling unit. In this case, the heat dissipation substrate 11 is made of aluminum, iron, silver, copper, or an alloy containing at least one of these, which has superior thermal conductivity, for example. In addition, in order to improve corrosion resistance, for example, plating using a material such as nickel may be performed on the surface of the heat dissipation substrate 11 formed integrally with the cooling unit. Specific examples of the material include, other than nickel, a nickel-phosphorus alloy, a nickel-boron alloy, and others. In addition, the semiconductor units 20*a* to 20*f* and heat dissipation substrate 11 of the semiconductor device 10 may be housed in a resin case (not illustrated). The resin case in this case is molded with control terminals for receiving gate voltage and external terminals for conducting input and output voltage.

Figure 3:
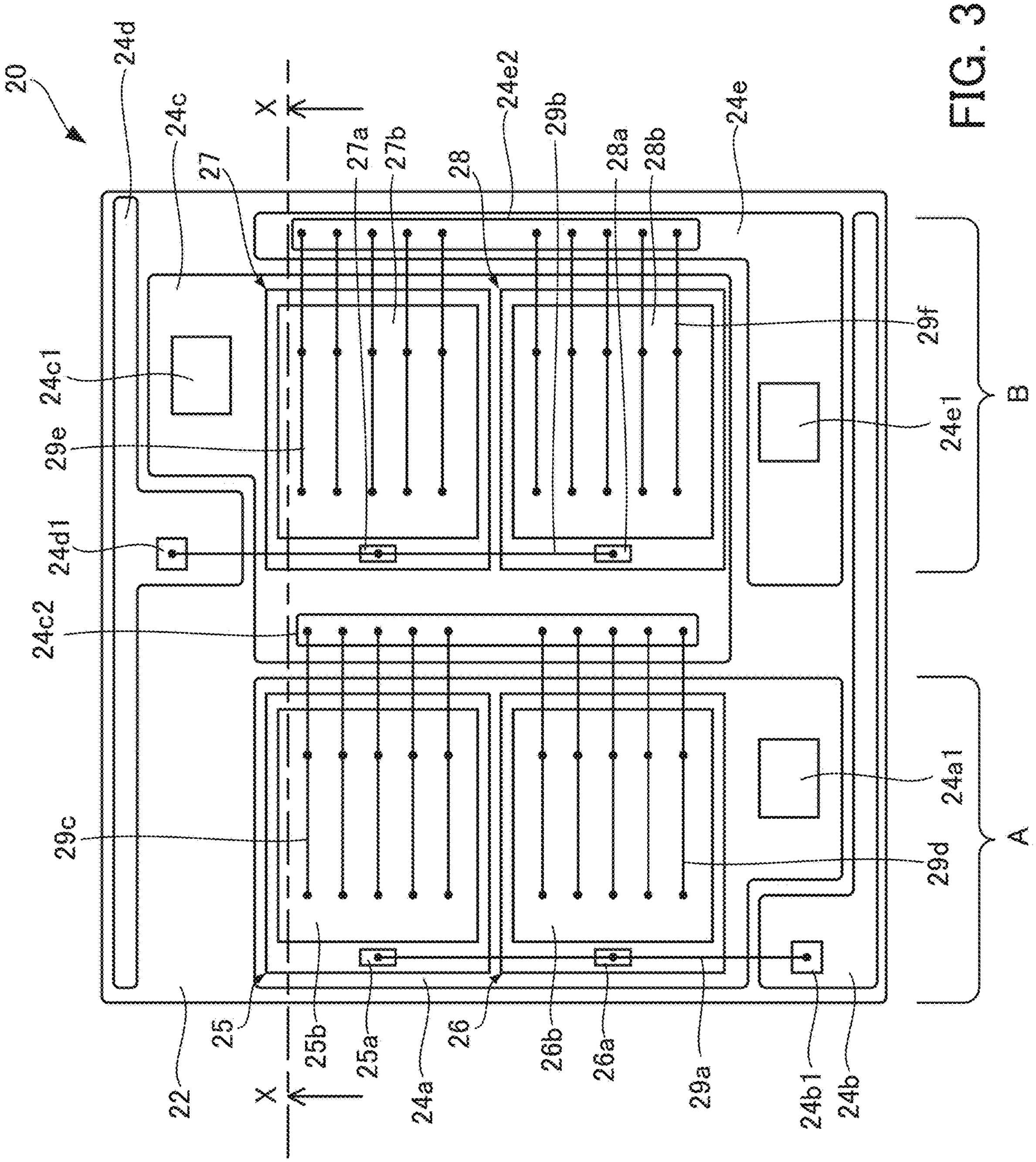
FIG. 3 is a plan view of a semiconductor unit according to the second embodiment.
Figure 4:
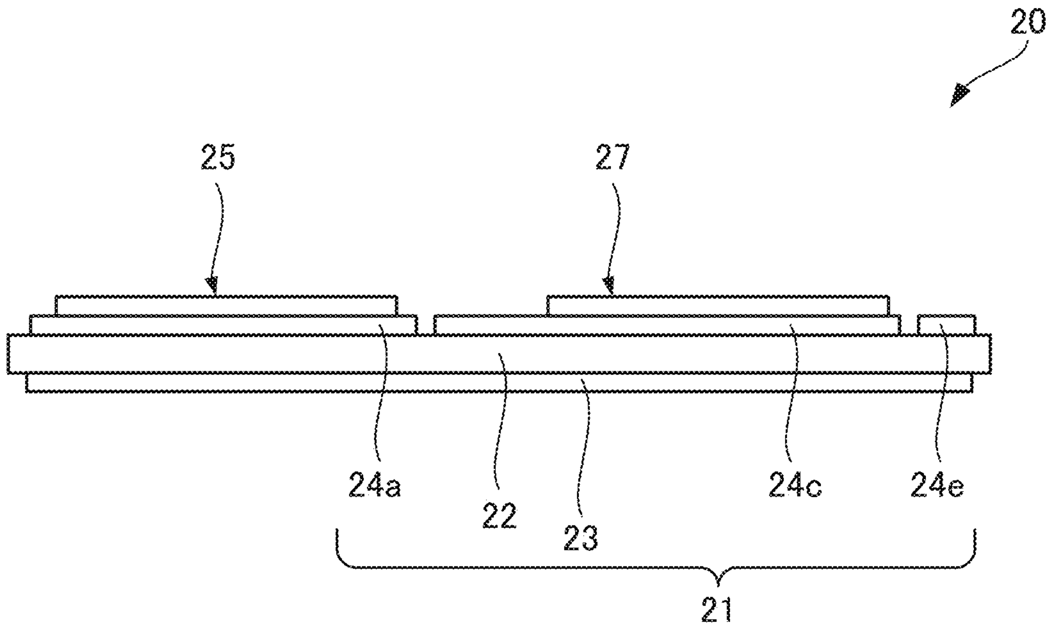
FIG. 4 is a cross-sectional view of a semiconductor unit according to the second embodiment.
Figure 5:
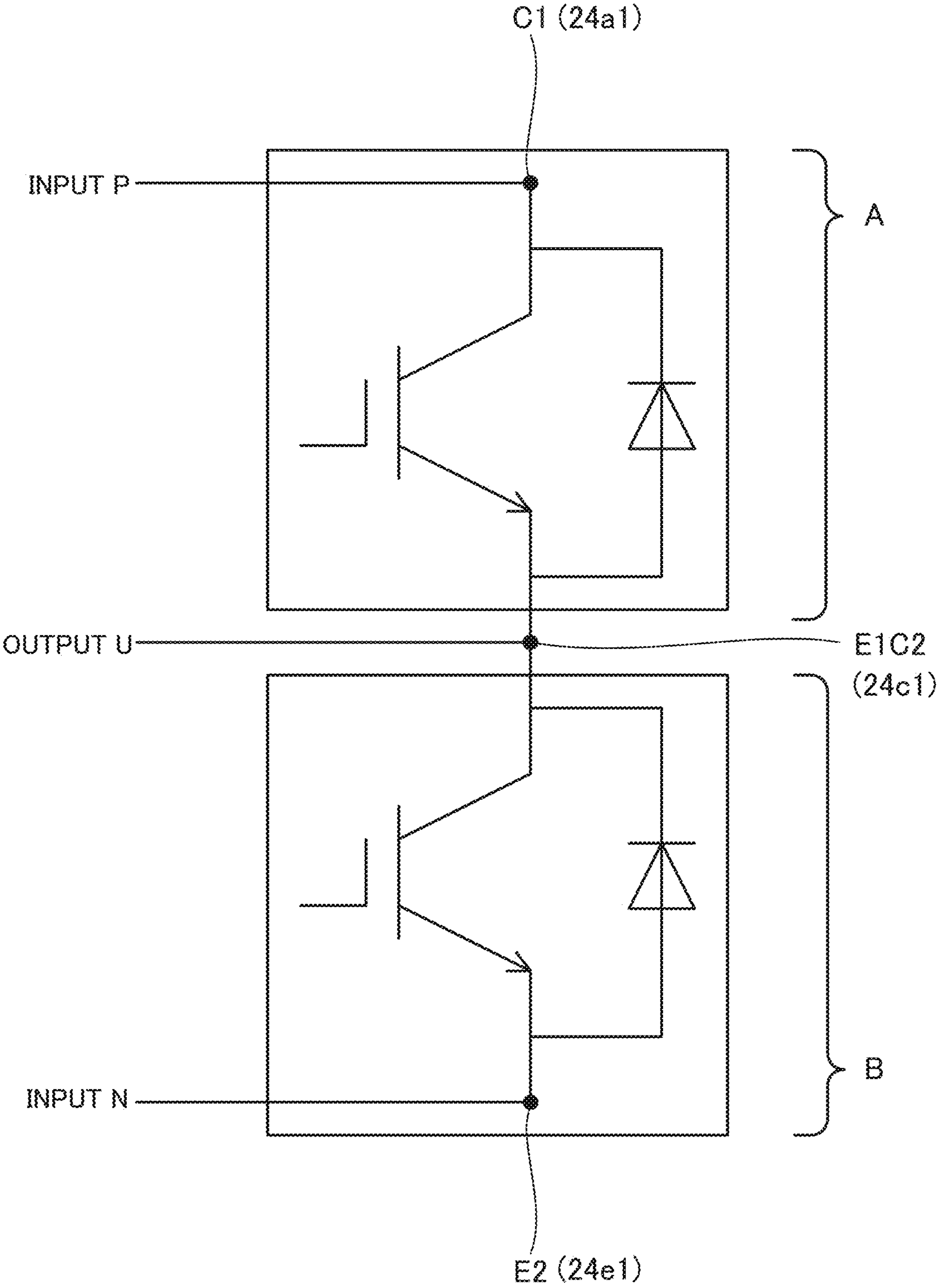
FIG. 5 is a circuit configuration diagram of a semiconductor unit according to the second embodiment.

The following describes the semiconductor unit 20 with reference to FIGS. 3 to 5. FIG. 3 is a plan view of a semiconductor unit according to the second embodiment, and FIG. 4 is a cross-sectional view of the semiconductor unit according to the second embodiment. In this connection, FIG. 4 is a cross-sectional view taken along the dot-dashed line X-X of FIG. 3. Note that bonding wires are not illustrated here. In addition, FIG. 5 is a circuit configuration diagram of a semiconductor unit according to the second embodiment. The semiconductor unit 20 includes a first arm part (upper arm part) A and a second arm part (lower arm part) B, which form upper and lower arm parts. As illustrated in FIGS. 3 and 4, the semiconductor unit 20 includes a ceramic circuit substrate 21 and semiconductor chips 25 to 28 disposed on the front surface of the ceramic circuit substrate 21. In addition, in the semiconductor unit 20, such a ceramic circuit substrate 21 is disposed on a heat dissipation substrate 11 via solder, silver solder, or the like (not illustrated) (see FIG. 2).

The semiconductor chips 25 to 28 are made of silicon or silicon carbide, and include an RC-IGBT switching element that integrates IGBT and FWD on a single chip. In the RC-IGBT chip, the collector of the IGBT is electrically connected to the cathode of the FWD and the emitter of the IGBT is electrically connected to the anode of the FWD. The RC-IGBT chip has a circuit in which IGBT and FWD are connected in inverse-parallel in this manner. Such semiconductor chips 25 to 28 each have an input electrode (drain electrode or collector electrode) serving as a main electrode on its rear surface, and a control electrode (gate electrode) and an output electrode (source electrode or emitter electrode) serving as a main electrode on its front surface, for example. In addition, the semiconductor chips 25 to 28 each have a gate electrode 25*a* to 28*a* at the center of a side portion of its front surface and an output electrode 25*b* to 28*b* in the center portion of its front surface. The ceramic circuit substrate 21 includes an electrically insulating plate 22 and a metal plate 23 formed on the rear surface of the electrically insulating plate 22. In addition, the ceramic circuit substrate 21 includes circuit patterns 24*a* to 24*e* formed on the front surface of the electrically insulating plate 22. The electrically insulating plate 22 is made of ceramics with high thermal conductivity, such as aluminum oxide, aluminum nitride, or silicon nitride, which has superior thermal conductivity. The metal plate 23 is made of metal such as aluminum, iron, silver, copper, or an alloy containing at least one of these, which has superior thermal conductivity. The circuit patterns 24*a* to 24*e* are made of metal such as copper or a copper alloy, which has superior electrical conductivity. To improve corrosion resistance, for example, plating may be performed on the surfaces of the circuit patterns 24*a* to 24*e* using a material such as nickel. Specific examples of the material include, other than nickel, a nickel-phosphorus alloy, a nickel-boron alloy, and others. The thickness of the circuit patterns 24*a* to 24*e* ranges from 0.1 mm to 1 mm, inclusive, for example. As the ceramic circuit substrate 21 configured as above, a DCB (direct copper bonding) substrate or an AMB (active metal brazed) substrate may be used, for example. The ceramic circuit substrate 21 is able to conduct heat generated by the semiconductor chips 25 to 28 to the heat dissipation substrate 11 via the circuit patterns 24*a* and 24*c*, electrically insulating plate 22, and metal plate 23. In this connection, the ceramic circuit substrate 21 is just an example, and a metal-based substrate or a lead frame with die pads may be used.

The circuit pattern 24*a* forms a collector pattern of the first arm part A. To the circuit pattern 24*a*, collector electrodes formed on the rear surfaces of the semiconductor chips 25 and 26 are joined via solder. The circuit pattern 24*a* is substantially rectangular, and a part thereof including a contact region 24*al* projects downward as seen in FIG. 3. On this circuit pattern 24*a*, the semiconductor chips 25 and 26 are disposed via solder (not illustrated) such that the gate electrodes 25*a* and 26*a* are aligned in a line. In this connection, the semiconductor chips 25 and 26 are disposed such that the gate electrodes 25*a* and 26*a* face one side parallel to the arrangement direction of the semiconductor chips 25 and 26. The gate electrodes 25*a* and 26*a* face one side (left side in FIG. 3) of the electrically insulating plate 22. In this connection, three or more semiconductor chips 25 and 26 may be disposed. In this case as well, the semiconductor chips are disposed such that the gate electrodes are aligned in a line and face one side parallel to the arrangement direction of the semiconductor chips. In this connection, the term "parallel" direction in this embodiment refers to any direction at an angle of ±30° to a parallel direction.

The circuit pattern 24*b* forms a control pattern of the first arm part A. To the circuit pattern 24*b*, a bonding wire 29*a* connected to the gate electrodes 25*a* and 26*a* of the semiconductor chips 25 and 26 is connected. The circuit pattern 24*b* has a connection region 24*b*1 that is located in a line with the gate electrodes 25*a* and 26*a* of the semiconductor chips 25 and 26. The circuit pattern 24*b* extends from a part including the connection region 24*b*1 perpendicularly to the arrangement direction of the semiconductor chips 25 and 26 along one side (bottom side in FIG. 3) of the electrically insulating plate 22. The circuit pattern 24*c* forms an emitter pattern of the first arm part A and a collector pattern of the second arm part B. To the circuit pattern 24*c*, bonding wires 29*c* and 29*d* connected to the output electrodes (emitter electrodes) 25*b* and 26*b* of the semiconductor chips 25 and 26 are connected. In addition, to the circuit pattern 24*c*, collector electrodes formed on the rear surfaces of the semiconductor chips 27 and 28 are joined via solder. The circuit pattern 24*c* is substantially rectangular, and a part thereof including a contact region 24*c*1 projects upward as seen in FIG. 3. The circuit pattern 24*c* is disposed side by side with the circuit pattern 24*a* and on the side (right side in FIG. 3) opposite to the gate electrodes 25*a* and 26*a*. The circuit pattern 24*c* also has a connection region 24*c*2 for the bonding wires 29*c* and 29*d* in parallel with the arrangement of the semiconductor chips 25 and 26. On this circuit pattern 24*c*, the semiconductor chips 27 and 28 are disposed via solder (not illustrated) such that gate electrodes 27*a* and 28*a* are aligned in a line. In this connection, the semiconductor chips 27 and 28 are disposed such that the gate electrodes 27*a* and 28*a* face one side parallel to the arrangement direction of the semiconductor chips 27 and 28. The arrangement of the gate electrodes 27*a* and 28*a* may be parallel to the arrangement of the gate electrodes 25*a* and 26*a* of the first arm part A. The gate electrodes 27*a* and 28*a* face the first arm part A (one side (left side in FIG. 3) of the electrically insulating plate 22). In this connection, three or more semiconductor chips 27 and 28 may be disposed. In this case as well, the semiconductor chips are disposed such that the gate electrodes are aligned in a line and face one side parallel to the arrangement direction of the semiconductor chips.

The circuit pattern 24*d* forms a control pattern of the second arm part B. To the circuit pattern 24*d*, a bonding wire 29*b* connected to the gate electrodes 27*a* and 28*a* of the semiconductor chips 27 and 28 is connected. The circuit pattern 24*d* has a connection region 24*d*1 that is located in a line with the gate electrodes 27*a* and 28*a* of the semiconductor chips 27 and 28 and on the side opposite to the connection region 24*b*1 with the semiconductor chips 25 to 27 therebetween. The circuit pattern 24*d* extends from a part including the connection region 24*d*1 perpendicularly to the arrangement direction of the semiconductor chips 27 and 28 along one side (upper side in FIG. 3) of the electrically insulating plate 22 as seen in FIG. 3. The term "perpendicular" direction in this embodiment refers to any direction at an angle of ±30° to a direction orthogonal to a reference direction (here, the arrangement direction). The circuit pattern 24*e* forms an emitter pattern of the second arm part B. The circuit pattern 24*e* has a connection region 24*e*2 to which bonding wires 29*e* and 29*f* connected to the output electrodes (emitter electrodes) 27*b* and 28*b* of the semiconductor chips 27 and 28 are connected. The circuit pattern 24*e* is disposed side by side with the circuit pattern 24*c* and has the connection region 24*e*2 that is located on the side (right side in FIG. 3) opposite to the gate electrodes 27*a* and 28*a*. Therefore, the circuit pattern 24*e* has a part that is located on the side opposite to the circuit pattern 24*a* with the circuit pattern 24*c* therebetween. The circuit pattern 24*e* has an orthogonal L shape between two orthogonal sides of the circuit pattern 24*c* and two sides of the electrically insulating plate 22. This circuit pattern 24*e* has the connection region 24*e*2 at the right portion of the electrically insulating plate 22 as seen in FIG. 3 and a contact region 24*e*1 at the lower portion of the electrically insulating plate 22 as seen in FIG. 3.

The bonding wires 29*a* to 29*f* are made of metal with superior electrical conductivity, such as aluminum or copper or an alloy containing at least one of these types. These preferably have a diameter ranging between 100 μm and 1 mm, inclusive. The bonding wire 29*a* sequentially joins the gate electrode 25*a* of the semiconductor chip 25, the gate electrode 26*a* of the semiconductor chip 26, and the connection region 24*b*1 of the circuit pattern 24*b*, which are aligned in a line, so that they are electrically connected to each other. The bonding wire 29*b* sequentially connects the gate electrode 27*a* of the semiconductor chip 27, the gate electrode 28*a* of the semiconductor chip 28, and the connection region 24*d*1 of the circuit pattern 24*d*, which are aligned in a line, so that they are electrically connected to each other. The bonding wires 29*c* electrically connect the output electrode 25*b* of the semiconductor chip 25 and the circuit pattern 24*c* in a direction perpendicular to the connection direction of the bonding wire 29*a*. More specifically, for this connection, the bonding wires 29*c* sequentially connect a plurality of points on the output electrode 25*b* of the semiconductor chip 25 and the connection region 24*c*2 of the circuit pattern 24*c*. The bonding wires 29*d* electrically connect the output electrode 26*b* of the semiconductor chip 26 and the circuit pattern 24*c* in a direction perpendicular to the connection direction of the bonding wire 29*a*. More specifically, the bonding wires 29*d* sequentially connect a plurality of points on the output electrode 26*b* of the semiconductor chip 26 and the connection region 24*c*2 of the circuit pattern 24*c*, so that they are connected to each other. The bonding wires 29*e* electrically connect the output electrode 27*b* of the semiconductor chip 27 and the circuit pattern 24*e* in a direction perpendicular to the connection direction of the bonding wire 29*b*. More specifically, for this connection, the bonding wires 29*e* sequentially connect a plurality of points on the output electrode 27*b* of the semiconductor chip 27 and the connection region 24*e*2 of the circuit pattern 24*e*. The bonding wires 29*f* electrically connect the output electrode 28*b* of the semiconductor chip 28 and the circuit pattern 24*e* in a direction perpendicular to the connection direction of the bonding wire 29*b*. More specifically, for this connection, the bonding wires 29*f* sequentially connect a plurality of points on the output electrode 28*b* of the semiconductor chip 28 and the connection region 24*e*2 of the circuit pattern 24*e*.

The above-described semiconductor chips 25 to 28, circuit patterns 24*a* to 24*e*, and bonding wires 29*a* to 29*f* form an inverter circuit illustrated in FIG. 5. In the semiconductor unit 20, the semiconductor chips 25 and 26, circuit patterns 24*a* and 24*b*, and bonding wire 29*a* form the first arm part (upper arm part) A. In addition, in the semiconductor unit 20, the semiconductor chips 27 and 28, circuit patterns 24*c* and 24*d*, and bonding wire 29*b* form the second arm part (lower arm part) B. In addition, the semiconductor unit 20 is connected to an external electrical device, which is externally provided to the semiconductor device 10, by an external connection terminal (not illustrated) formed using a lead frame or the like. The external connection terminal includes a C1 terminal (corresponding to the contact region 24*a*1), an E2 terminal (corresponding to the contact region 24*e*1), and an E1C2 terminal (corresponding to the contact region 24*c*1). In addition, the high-potential terminal of an external power supply is connected to the C1 terminal serving as an input P terminal, and the low-potential terminal of the external power supply is connected to the E2 terminal serving as an input N terminal. Then, a load (not illustrated) is connected to the E1C2 terminal serving as an output U terminal of the semiconductor unit 20. By doing so, the semiconductor unit 20 functions as an inverter. For example, in the semiconductor unit 20 configured as above, an external connection terminal (not illustrated) may be joined to the contact regions 24*a*1, 24*c*1 and 24*e*1, and the semiconductor chips 25 to 28 and bonding wires 29*a* to 29*f* on the ceramic circuit substrate 21 may be sealed with a sealing member. In this case, the sealing member may be made of thermosetting resin, such as maleimide-modified epoxy resin, maleimide-modified phenolic resin, or maleimide resin.

Figure 6A:
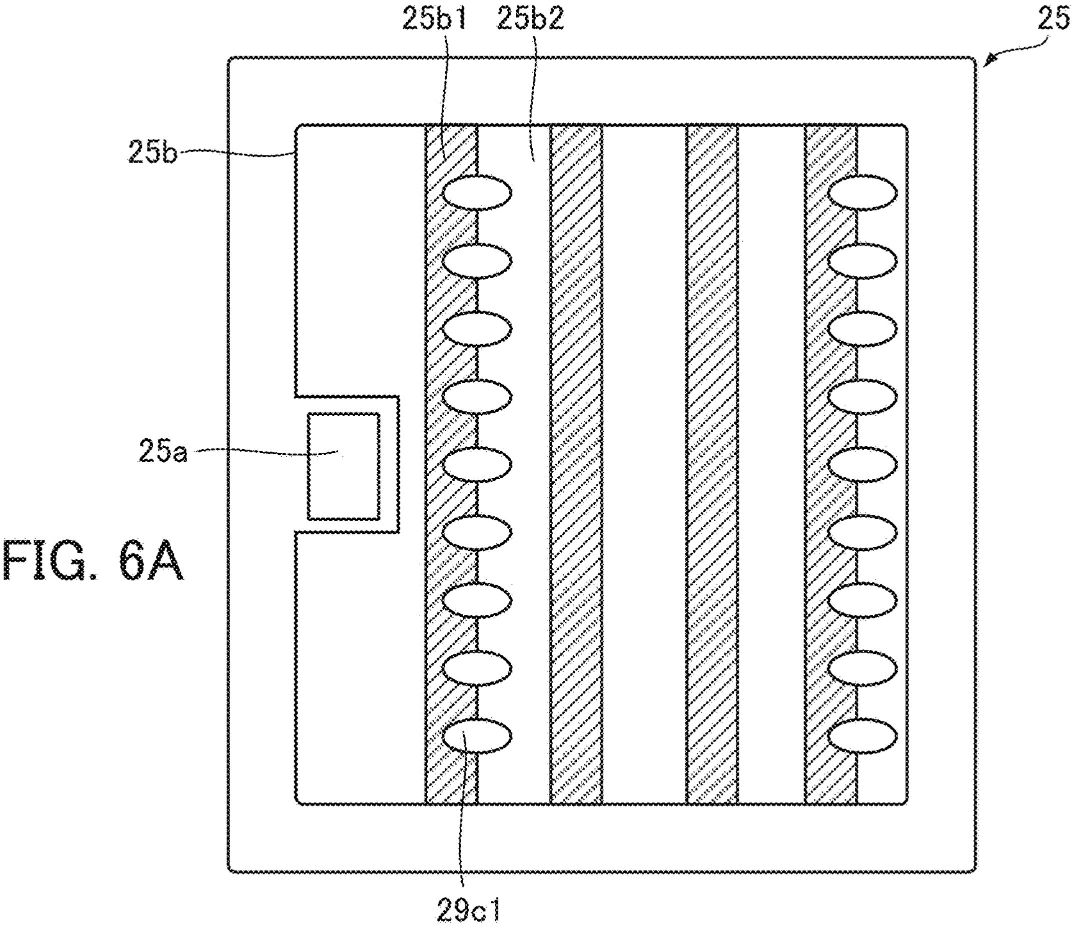
FIGS. 6A and 6B are views for explaining connections of bonding wires to the output electrode of a semiconductor chip provided in a semiconductor unit according to the second embodiment.
Figure 6B:
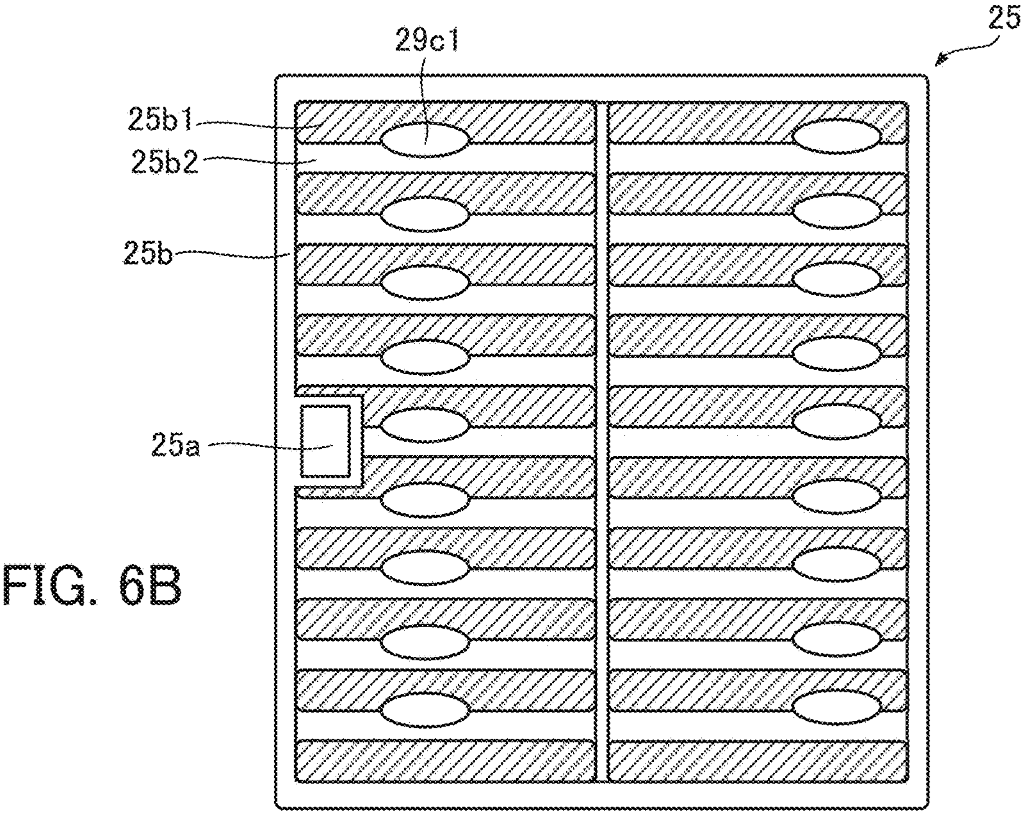

The following describes stitch bonding of the bonding wires 29*c*, 29*d*, 29*e*, and 29*f* to the output electrodes 25*b* to 28*b* of the semiconductor chips 25 to 28, with reference to FIGS. 6A and 6B. FIGS. 6A and 6B are views for explaining connections of bonding wires to the output electrode of a semiconductor chip provided in a semiconductor unit according to the second embodiment. In this connection, FIGS. 6A and 6B illustrate the semiconductor chip 25 out of the semiconductor chips 25 to 28, by way of example, and FIGS. 6A and 6B illustrate semiconductor chips 25 that are different types of RC-IGBT chips. As illustrated in FIG. 6A, the semiconductor chip 25 has an output electrode 25*b* where an FWD region 25*b*1 and an IGBT region 25*b*2 are repeatedly and alternately arranged. In connecting the bonding wires 29*c* to this output electrode 25*b* by stitch bonding, the bonding wires 29*c* are each bonded to bonding points 29*c*1 on the border between the FWD region 25*b*1 and the IGBT region 25*b*2. Likewise, as illustrated in FIG. 6B, in an output electrode 25*b* of different type from that in FIG. 6A in the semiconductor chip 25, bonding wires are each bonded to bonding points 29*c*1 on the border between an FWD region 25*b*1 and an IGBT region 25*b*2. This minimizes an imbalance of heat generation by the output electrode 25*b* of the semiconductor chip 25 in the bonding wires 29*c*, which makes it possible to prevent occurrence of a failure and others due to the heat generated by the semiconductor chip 25. In this connection, the same applies to the other semiconductor chips 26 to 28.

In the above-described semiconductor device 10, a plurality of semiconductor units 20 are disposed in one direction on the heat dissipation substrate 11. In addition, the semiconductor units 20 each have first and second arm parts (upper and lower arm parts) A and B. The first arm part (upper arm part) A includes the semiconductor chips 25 and 26, circuit patterns 24*a* and 24*b*, and bonding wire 29*a*. The semiconductor chips 25 and 26 are RC-IGBT chips, are approximately square, and respectively have the gate electrodes 25*a* and 26*a* at side portions of their front surfaces. The circuit pattern 24*a* is rectangular in plan view so that the side portions of the semiconductor chips 25 and 26, which are approximately square, are aligned in a line and the gate electrodes 25*a* and 26*a* are aligned in a line, and the semiconductor chips 25 and 26 are disposed thereon. The connection region 24*b*1 of the circuit pattern 24*b* is aligned in a line with the gate electrodes 25*a* and 26*a*. In addition, the bonding wire 29*a* electrically connects the gate electrodes 25*a* and 26*a* and the connection region 24*b*1 of the circuit pattern 24*b* by stitch bonding. Likewise, the second arm part (lower arm part) B includes the semiconductor chips 27 and 28, which are approximately square, circuit patterns 24*c* and 24*d*, and bonding wire 29*b*. The semiconductor chips 27 and 28 are RC-IGBT chips, are approximately square, and respectively have the gate electrodes 27*a* and 28*a* at side portions of their front surfaces. The circuit pattern 24*c* is rectangular in plan view so that the side portions of the semiconductor chips 27 and 28 are aligned in a line and the gate electrodes 27*a* and 28*a* are aligned in a line, and the semiconductor chips 27 and 28 are disposed thereon. The connection region 24*d*1 of the circuit pattern 24*d* is aligned in a line with the gate electrodes 27*a* and 28*a*. In addition, the bonding wire 29*b* electrically connects the gate electrodes 27*a* and 28*a* and the connection region 24*d*1 of the circuit pattern 24*d* by stitch bonding.

With the above configuration, the first arm part (upper arm part) A and the second arm part (lower arm part) B are able to prevent a decrease in gate response speed and also to reduce the possibility of non-uniform current generation. Thereby, it is possible to minimize an increase in temperature when a current flows and also to prevent concentration of heat generation. In addition, it is possible to make the most of the chip mounting areas of the circuit patterns 24*a* and 24*c* for the semiconductor chips 25 to 28 and to thereby increase output current. In addition, in the semiconductor unit 20, the bonding wire 29*a* provided on the gate electrodes 25*a* and 26*a* of the semiconductor chips 25 and 26 and the bonding wire 29*b* provided on the gate electrodes 27*a* and 28*a* of the semiconductor chips 27 and 28 are in opposite directions. Therefore, in the semiconductor unit 20, the circuit pattern 24*a* and semiconductor chips 25 and 26 and the circuit pattern 24*c* and semiconductor chips 27 and 28 are disposed substantially point symmetrically, and so are the bonding wires 29*a* and 29*b*. This arrangement minimizes an imbalance of heat generation when a current flows in the semiconductor unit 20. This makes it possible to prevent occurrence of a failure and others due to the imbalance of heat generation in the semiconductor unit 20.

In addition, in the semiconductor unit 20, the bonding wires 29*c* to 29*f* are connected to the output electrodes 25*b* to 28*b* of the semiconductor chips 25 to 28 by stitch bonding in such a way that each wire is bonded on the border between an FWD region and an IGBT region. This minimizes the imbalance of heat generation by the output electrodes 25*b* to 28*b* of the semiconductor chips 25 to 28 in the bonding wires 29*c* to 29*f*, which in turn makes it possible to prevent occurrence of a failure and others due to heat generated by the semiconductor chips 25 to 28.

In this connection, the number of semiconductor chips 25 to 28 of the semiconductor unit 20 is just an example and is not limited to the case where two semiconductor chips are disposed in each arm part and two arm parts are included. For example, three or more semiconductor chips may be disposed in each arm part. In this case as well, the semiconductor chips are disposed such that the gate electrodes are aligned in a line and face one side parallel to the arrangement direction of the semiconductor chips. In addition, for example, an IGBT chip and an FWD chip may be disposed together as semiconductor chips in each arm part. In this case as well, a plurality of IGBT chips are disposed such that the gate electrodes are aligned in a line and face one side parallel to the arrangement direction of the IGBT chips. The plurality of FWD chips may be disposed in a line that is parallel to and different from the line of the IGBT chips or in a line with the IGBT chips. In addition, for example, the semiconductor unit 20 may be formed by three or more arm parts. In this case, the three or more arm parts are arranged in a direction perpendicular to the arrangement direction of the semiconductor chips.

Third Embodiment

Figure 7:
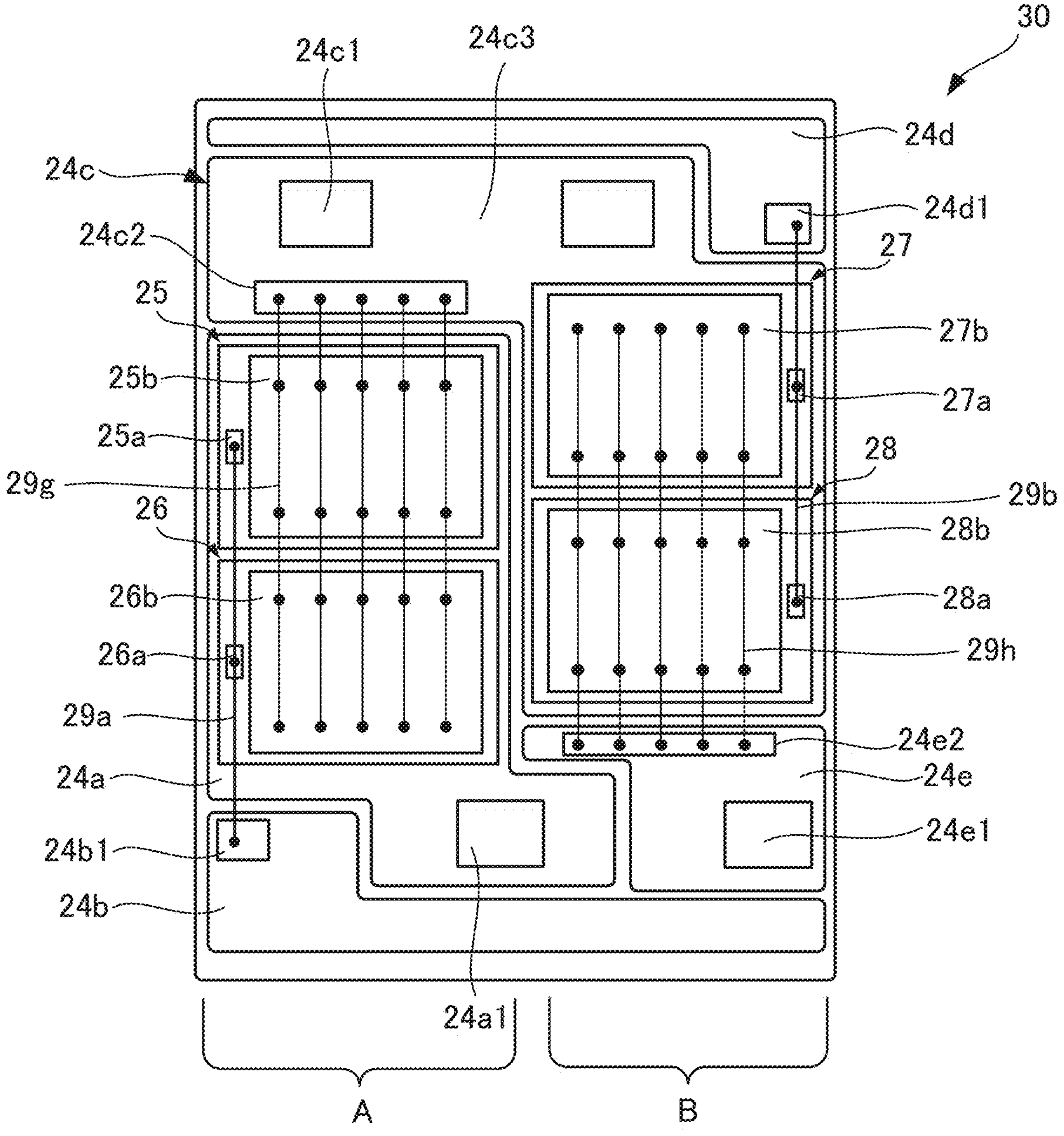
FIG. 7 is a plan view of a semiconductor unit according to a third embodiment.

A third embodiment describes a semiconductor unit that is different from the semiconductor unit 20 of the second embodiment, with reference to FIG. 7. More specifically, in a semiconductor unit of the third embodiment, the connection direction of bonding wires connected to the output electrodes of semiconductor chips is anti-parallel to that of a bonding wire connected to the gate electrodes of the semiconductor chips. FIG. 7 is a plan view of a semiconductor unit according to the third embodiment. In this connection, in the semiconductor unit 30 of the third embodiment, elements equivalent to those in the semiconductor unit 20 of the second embodiment are designated by the same reference numerals as used in the semiconductor unit 20 of the second embodiment, and their explanation is omitted. In addition, the semiconductor unit 30 includes a ceramic circuit substrate (FIG. 4) that is equivalent to that in the semiconductor unit 20 except for the shapes of circuit patterns, and implements the same circuit configuration (FIG. 5).

The semiconductor unit 30 includes a first arm part (upper arm part) A and a second arm part (lower arm part) B, which form upper and lower arm parts. A circuit pattern 24*a* forms a collector pattern of the first arm part A. To the circuit pattern 24*a*, collector electrodes formed on the rear surfaces of the semiconductor chips 25 and 26 are joined via solder. The circuit pattern 24*a* is substantially rectangular and a part thereof including a contact region 24*al* projects downward as seen in FIG. 7. In this circuit pattern 24*a*, semiconductor chips 25 and 26 are disposed via solder (not illustrated) such that gate electrodes 25*a* and 26*a* are aligned in a line. In this connection, the semiconductor chips 25 and 26 are disposed such that the gate electrodes 25*a* and 26*a* face one side parallel to the arrangement direction of the semiconductor chips 25 and 26. The gate electrodes 25*a* and 26*a* face one side (left side in FIG. 7) of an electrically insulating plate 22. In this connection, three or more semiconductor chips 25 and 26 may be disposed. In this case as well, the semiconductor chips are disposed such that the gate electrodes are aligned in a line and face one side parallel to the arrangement direction of the semiconductor chips. In addition, the term "parallel" direction in this embodiment refers to any direction at an angle of ±30° to a parallel direction.

The circuit pattern 24*b* forms a control pattern of the first arm part A. To the circuit pattern 24*b*, a bonding wire 29*a* connected to the gate electrodes 25*a* and 26*a* of the semiconductor chips 25 and 26 is connected. The circuit pattern 24*b* has a connection region 24*b*1 that is located in a line with the gate electrodes 25*a* and 26*a* of the semiconductor chips 25 and 26. The circuit pattern 24*b* extends from a part including the connection region 24*b*1 perpendicularly to the arrangement direction of the semiconductor chips 25 and 26 along one side (lower side in FIG. 7) of the electrically insulating plate 22 as seen in FIG. 7.

The circuit pattern 24*c* forms an emitter pattern of the first arm part A and a collector pattern of the second arm part B. To the circuit pattern 24*c*, bonding wires 29*g* connected to the output electrodes (emitter electrodes) 25*b* and 26*b* of the semiconductor chips 25 and 26 are connected. In addition, to the circuit pattern 24*c*, collector electrodes formed on the rear surfaces of the semiconductor chips 27 and 28 are joined via solder. The circuit pattern 24*c* has a substantially L shape along a right side and upper side of the semiconductor unit 30 as seen in FIG. 7. The right region of the circuit pattern 24*c* is located on the side opposite to the gate electrodes 25*a* and 26*a*. The semiconductor chips 27 and 28 are disposed in that region. The upper region of the circuit pattern 24*c* is an extension region 24*c*3 that extends from the top of the right region along the top side of the semiconductor unit 30 in the left direction. That is, the extension region 24*c*3 is located on the side of the circuit pattern 24*a* opposite to the connection direction of the bonding wire 29*a* and extends in a direction orthogonal to the connection direction. The extension region 24*c*3 of the circuit pattern 24*c* has a contact region 24*c*1 to which an external connection terminal (not illustrated) is connected and a connection region 24*c*2 for the bonding wires 29*g*. The extension region 24*c*3 of the circuit pattern 24*c* includes the connection region 24*c*2 that is located on an extension line parallel to the arrangement of the semiconductor chips 25 and 26 and that is connected to the bonding wires 29*g* connected to the output electrodes (emitter electrodes) 25*b* and 26*b* of the semiconductor chips 25 and 26. On this circuit pattern 24*c*, the semiconductor chips 27 and 28 are disposed via solder (not illustrated) such that the gate electrodes 27*a* and 28*a* are aligned in a line. In this connection, the semiconductor chips 27 and 28 are disposed such that the gate electrodes 27*a* and 28*a* face one side parallel to the arrangement direction of the semiconductor chips 27 and 28. The arrangement of the gate electrodes 27*a* and 28*a* may be parallel to that of the gate electrodes 25*a* and 26*a* of the first arm part A. The gate electrodes 27*a* and 28*a* are located on the side opposite to the gate electrodes 25*a* and 26*a* and face a side (one side (right side in FIG. 7) of the electrically insulating plate 22) opposite to the first arm part A. In this connection, three or more semiconductor chips 27 and 28 may be disposed. In this case as well, the semiconductor chips may be disposed such that the gate electrodes are aligned in a line and face one side parallel to the arrangement direction of the semiconductor chips.

The circuit pattern 24*d* forms a control pattern of the second arm part B. To the circuit pattern 24*d*, a bonding wire 29*b* connected to the gate electrodes 27*a* and 28*a* of the semiconductor chips 27 and 28 is connected. The circuit pattern 24*d* has a connection region 24*d*1 that is located in a line with the gate electrodes 27*a* and 28*a* of the semiconductor chips 27 and 28 and in a point symmetry with the connection region 24*b*1. The circuit pattern 24*d* extends a part including the connection region 24*d*1 from perpendicularly to the arrangement direction of the semiconductor chips 27 and 28 along one side (top side in FIG. 7) of the electrically insulating plate 22. In this connection, the term "perpendicular" direction in this embodiment refers to any direction at an angle of ±30° to a direction orthogonal to a reference direction (here, arrangement direction). The circuit pattern 24*e* forms an emitter pattern of the second arm part B. The circuit pattern 24*e* has a connection region 24*e*2 to which bonding wires 29*h* connected to the output electrodes (emitter electrodes) 27*b* and 28*b* of the semiconductor chips 27 and 28 are connected. The circuit pattern 24*e* is located side by side with the circuit pattern 24*c* and the projecting part of the circuit pattern 24*a*, and has a connection region 24*e*2 that is located on the side (bottom side in FIG. 7) opposite to the circuit pattern 24*d*. This circuit pattern 24*e* also has a contact region 24*e*1 at the lower right portion of the electrically insulating plate 22 as seen in FIG. 7.

The bonding wires 29*a*, 29*b*, 29*g* and 29*h* are configured as in the bonding wires 29*a* to 29*f* of the second embodiment. The bonding wire 29*a* sequentially connects the gate electrode 25*a* of the semiconductor chip 25, the gate electrode 26*a* of the semiconductor chip 26, and the connection region 24*b*1 of the circuit pattern 24*b*, which are aligned in a line, so that they are electrically connected to each other. The bonding wire 29*b* sequentially connects the gate electrode 27*a* of the semiconductor chip 27, the gate electrode 28*a* of the semiconductor chip 28, and the connection region 24*d*1 of the circuit pattern 24*d*, which are aligned in a line, so that they are electrically connected to each other.

The bonding wires 29*g* electrically connect the output electrode 25*b* of the semiconductor chip 25, the output electrode 26*b* of the semiconductor chip 26, and the circuit pattern 24*c* in a direction anti-parallel to the connection direction of the bonding wire 29*a*. More specifically, for this connection, the bonding wires 29*g* sequentially connect a plurality of points on the output electrode 25*b* of the semiconductor chip 25, a plurality of points on the output electrode 26*b* of the semiconductor chip 26, and the connection region 24*c*2 of the circuit pattern 24*c*. The bonding wires 29*h* electrically connect the output electrode 27*b* of the semiconductor chip 27, the output electrode 28*b* of the semiconductor chip 28, and the circuit pattern 24*e* in a direction anti-parallel to the connection direction of the bonding wire 29*b*. More specifically, for this connection, the bonding wires 29*h* sequentially connect a plurality of points on the output electrode 27*b* of the semiconductor chip 27, a plurality of points on the output electrode 28*b* of the semiconductor chip 28, and the connection region 24*e*2 of the circuit pattern 24*e*. In this connection, stitch bonding as described with reference to FIGS. 6A and 6B is performed for these bonding wires 29*g* and 29*h*.

As described above, the semiconductor chips 25 to 28, circuit patterns 24*a* to 24*e*, and bonding wires 29*a*, 29*b*, 29*g*, and 29*h* form an inverter circuit illustrated in FIG. 5, as in the second embodiment. In the semiconductor unit 30, the semiconductor chips 25 and 26, circuit patterns 24*a* and 24*b*, and bonding wire 29*a* form the first arm part (upper arm part) A. In addition, in the semiconductor unit 30, the semiconductor chips 27 and 28, the circuit patterns 24*c* and 24*d*, and bonding wire 29*b* form the second arm part (lower arm part) B. In addition, the semiconductor unit 30 is connected to an external electrical device, which is externally provided to the semiconductor device 10, by an external connection terminal (not illustrated) formed using a lead frame or the like. The external connection terminal includes a C1 terminal (corresponding to the contact region 24*a*1), an E2 terminal (corresponding to the contact region 24*e*1), and an E1C2 terminal (corresponding to the contact region 24*c*1). Then, the high-potential terminal of an external power supply is connected to the C1 terminal serving as an input P terminal and the low-potential terminal of the external power supply is connected to an E2 terminal serving as an input N terminal. Then, a load (not illustrated) is connected to the E1C2 terminal serving as an output U terminal of the semiconductor unit 30. Thereby, the semiconductor unit 30 functions as an inverter. In the semiconductor unit 30 configured as above, for example, an external connection terminal (not illustrated) may be joined to the contact regions 24*a*1, 24*c*1, and 24*e*1, and the semiconductor chips 25 to 28 and bonding wires 29*a*, 29*b*, 29*g*, and 29*h* on the ceramic circuit substrate 21 may be sealed with a sealing member.

In a semiconductor device 10 including the above semiconductor unit 30, the first arm part (upper arm part) A and the second arm part (lower arm part) B are able to prevent a decrease in gate response speed, as in the second embodiment and therefore to reduce the possibility of non-uniform current generation. Thereby, it is possible to minimize an increase in temperature when a current flows and also to prevent concentration of heat generation. In addition, it is possible to make the most of the chip mounting areas of the circuit patterns 24*a* and 24*c* for the semiconductor chips 25 to 28 and to thereby increase output current. In addition, in the semiconductor unit 30, the bonding wire 29*a* provided on the gate electrodes 25*a* and 26*a* of the semiconductor chips 25 and 26 and the bonding wire 29*b* provided on the gate electrodes 27*a* and 28*a* of the semiconductor chips 27 and 28 are in opposite directions. Therefore, in the semiconductor unit 30, the circuit pattern 24*a* and semiconductor chips 25 and 26 and the circuit pattern 24*c* and semiconductor chips 27 and 28 are disposed substantially point symmetrically, and so are the bonding wires 29*a* and 29*b*. This minimizes an imbalance of heat generation when a current flows in the semiconductor chip 30. Thus, it is possible to prevent occurrence of a failure and others due to the imbalance of heat generation in the semiconductor unit 30.

Fourth Embodiment

Figure 8:
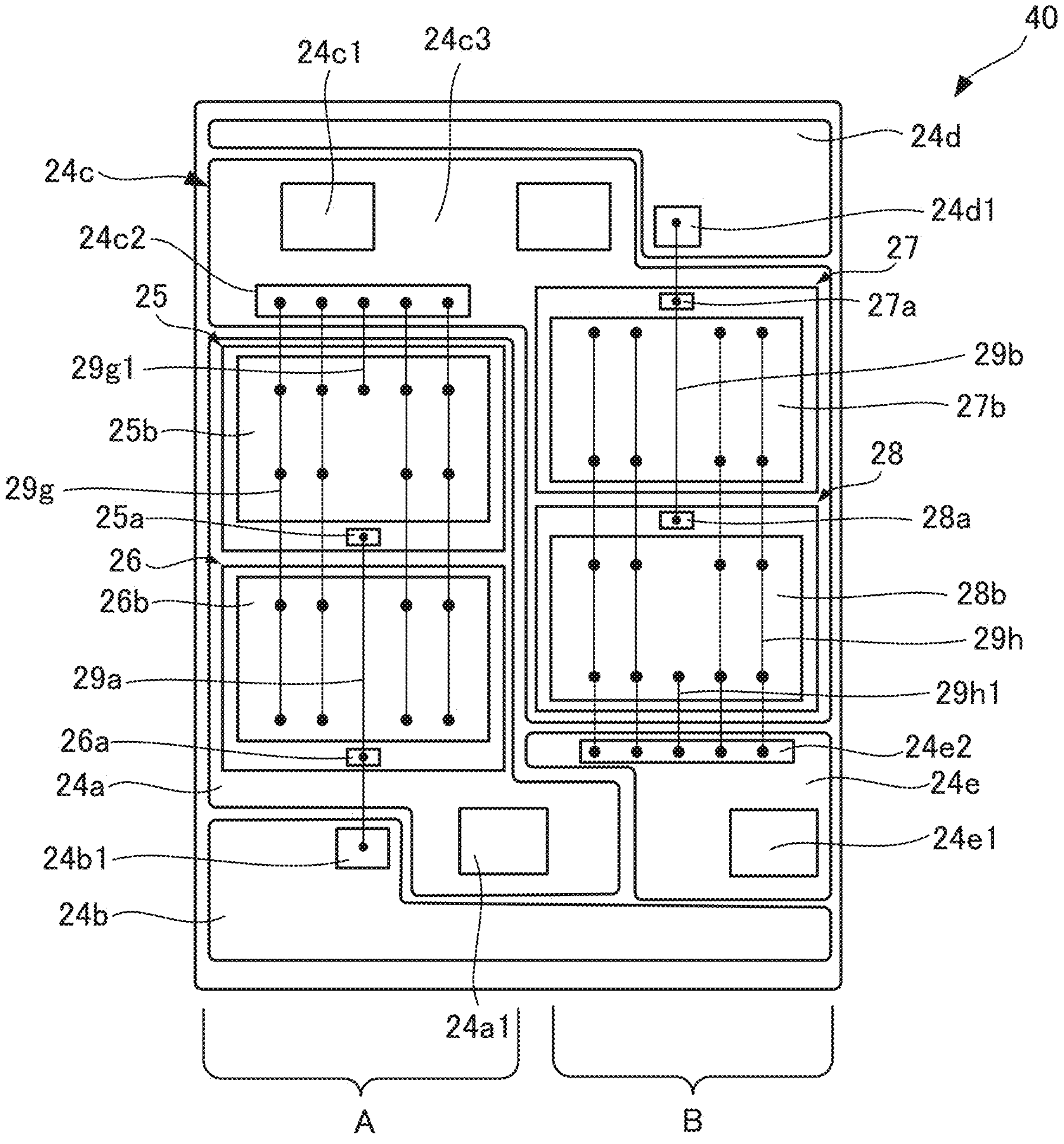
FIG. 8 is a plan view of a semiconductor unit according to a fourth embodiment.

A fourth embodiment describes a semiconductor unit that is different from the semiconductor unit 30 of the third embodiment, with reference to FIG. 8. More specifically, in a semiconductor unit of the fourth embodiment, semiconductor chips are disposed such that the gate electrodes of the semiconductor chips face opposite to the connection direction of bonding wires connected to the output electrodes of the semiconductor chips. FIG. 8 is a plan view of a semiconductor unit according to the fourth embodiment. In this connection, in the semiconductor unit 40 of the fourth embodiment, elements equivalent to those in the semiconductor unit 30 of the third embodiment are designated by the same reference numerals as used in the semiconductor unit 30 of the third embodiment, and their explanation is omitted. In addition, the semiconductor unit 40 has circuit patterns whose shapes are approximately the same as those of the semiconductor unit 30, includes the same ceramic circuit substrate (FIG. 4) as the semiconductor unit 30, and implements the same circuit configuration (FIG. 5) as the semiconductor unit 30.

The semiconductor unit 40 includes a first arm part (upper arm part) A and a second arm part (lower arm part) B, which form upper and lower arm parts. A circuit pattern 24*a* forms a collector pattern of the first arm part A. To the circuit pattern 24*a*, collector electrodes formed on the rear surfaces of semiconductor chips 25 and 26 are joined via solder. The circuit pattern 24*a* is substantially rectangular and a part thereof including a contact region 24*al* projects downward as seen in FIG. 8.

In this circuit pattern 24*a*, the semiconductor chips 25 and 26 are disposed via solder (not illustrated) such that gate electrodes 25*a* and 26*a* thereof are aligned in a line. Especially, in the semiconductor unit 40, side portions of the semiconductor chips 25 and 26 where the gate electrodes 25*a* and 26*a* are disposed face the connection direction of a bonding wire 29*a*, which will be described later. In other words, the semiconductor chips 25 and 26 are arranged such that the gate electrodes 25*a* and 26*a* face the connection direction of the bonding wire 29*a* (a connection region 24*b*1 of a circuit pattern 24*b* to be described later) and also face opposite to the connection direction of bonding wires 29*g* to be described later. Therefore, the gate electrodes 25*a* and 26*a* face one side (lower side in FIG. 8) of an electrically insulating plate 22. In this connection, three or more semiconductor chips 25 and 26 may be disposed. In this case as well, the semiconductor chips are disposed such that the gate electrodes thereof are aligned in a line and face the connection direction of the bonding wire 29*a*.

The circuit pattern 24*b* forms a control pattern of the first arm part A. To the circuit pattern 24*b*, the bonding wire 29*a* connected to the gate electrodes 25*a* and 26*a* of the semiconductor chips 25 and 26 is connected. The circuit pattern 24*b* has the connection region 24*b*1 that is located in a line with the gate electrodes 25*a* and 26*a* of the semiconductor chips 25 and 26. The circuit pattern 24*b* extends from a part including the connection region 24*b*1 perpendicularly to the arrangement direction of the semiconductor chips 25 and 26 along one side (bottom side in FIG. 8) of the electrically insulating plate 22 as seen in FIG. 8.

A circuit pattern 24*c* forms an emitter pattern of the first arm part A and a collector pattern of the second arm part B. To the circuit pattern 24*c*, the bonding wires 29*g* connected to the output electrodes (emitter electrodes) 25*b* and 26*b* of the semiconductor chips 25 and 26 are connected. In addition, to the circuit pattern 24*c*, a single bonding wire 29*g*1 (first main current single wire) connected to the output electrode (emitter electrode) 25*b* of the semiconductor chip 25 is connected. In addition, to the circuit pattern 24*c*, collector electrodes formed on the rear surfaces of semiconductor chips 27 and 28 are joined via solder.

The circuit pattern 24*c* has a substantially L-shape along the right side and top side of the semiconductor unit 40 as seen in FIG. 8. The semiconductor chips 27 and 28 are disposed in the right region of the circuit pattern 24*c*. The upper region of the circuit pattern 24*c* is an extension region 24*c*3 that extends from the top of the right region along the top side of the semiconductor unit 40 in the left direction. That is, the extension region 24*c*3 is located on the side of the circuit pattern 24*a* opposite to the connection direction of the bonding wire 29*a* and extends in a direction orthogonal to the connection direction. The extension region 24*c*3 of the circuit pattern 24*c* has a contact region 24*c*1 to which an external connection terminal (not illustrated) is connected and a connection region 24*c*2 for the bonding wires 29*g* and single bonding wire 29*g*1. The extension region 24*c*3 of the circuit pattern 24*c* includes the connection region 24*c*2 that is located on an extension line parallel to the arrangement of the semiconductor chips 25 and 26 and that is connected to the bonding wires 29*g* connected to the output electrodes (emitter electrodes) 25*b* and 26*b* of the semiconductor chips 25 and 26 and the single bonding wire 29*g*1 connected to the output electrode (emitter electrode) 25*b*.

On this circuit pattern 24*c*, the semiconductor chips 27 and 28 are disposed via solder (not illustrated) such that gate electrodes 27*a* and 28*a* thereof are aligned in a line. Especially, in the semiconductor unit 40, side portions of the semiconductor chips 27 and 28 where the gate electrodes 27*a* and 28*a* are disposed face the connection direction of a bonding wire 29*b* to be described later. In other words, the semiconductor chips 27 and 28 are disposed such that the gate electrodes 27*a* and 28*a* face the connection direction of the bonding wire 29*b* (a connection region 24*d*1 of a circuit pattern 24*d* to be described later) and face opposite to the connection direction of bonding wires 29*h* to be described later. Therefore, the gate electrodes 27*a* and 28*a* face one side (upper side in FIG. 8) of the electrically insulating plate 22. In addition, the gate electrodes 27*a* and 28*a* may be aligned in parallel to the arrangement of the gate electrodes 25*a* and 26*a* of the first arm part A. In this connection, three or more semiconductor chips 27 and 28 may be disposed. In this case as well, the semiconductor chips may be disposed such that the gate electrodes thereof are aligned in a line and face the connection direction of the bonding wire 29*b*. In addition, the term "parallel" direction in this embodiment refers to any direction at an angle of ±30° to a parallel direction.

The circuit pattern 24*d* forms a control pattern of the second arm part B. To the circuit pattern 24*d*, the bonding wire 29*b* connected to the gate electrodes 27*a* and 28*a* of the semiconductor chips 27 and 28 is connected. The circuit pattern 24*d* has the connection region 24*d*1 that is located in a line with the gate electrodes 27*a* and 28*a* of the semiconductor chips 27 and 28 and in a point symmetry with the connection region 24*b*1. The circuit pattern 24*d* extends from a part including the connection region 24*d*1 perpendicularly to the arrangement direction of the semiconductor chips 27 and 28 along one side (top side in FIG. 8) of the electrically insulating plate 22. In this connection, the term "perpendicular" direction in this embodiment refers to any direction at an angle of ±30° to a direction orthogonal to a reference direction (here, arrangement direction).

A circuit pattern 24*e* forms an emitter pattern of the second arm part B. The circuit pattern 24*e* has a connection region 24*e*2 to which the bonding wires 29*h* connected to output electrodes (emitter electrodes) 27*b* and 28*b* of the semiconductor chips 27 and 28 are connected. The circuit pattern 24*e* is located side by side with the circuit pattern 24*c* and the projecting part of the circuit pattern 24*a* and has the connection region 24*e*2 that is located on the side (lower side in FIG. 8) opposite to the circuit pattern 24*d*. This circuit pattern 24*e* also has a contact region 24*e*1 at the lower right portion of the electrically insulating plate 22 as seen in FIG. 8.

The bonding wires 29*a*, 29*b*, 29*g* and 29*h* and single bonding wires 29*g*1 and 29*h*1 are configured as in the bonding wires 29*a* to 29*f* of the third embodiment. The bonding wire 29*a* sequentially connects the gate electrode 25*a* of the semiconductor chip 25, the gate electrode 26*a* of the semiconductor chip 26, and the connection region 24*b*1 of the circuit pattern 24*b*, which are aligned in a line, so that they are electrically connected to each other. The bonding wire 29*b* sequentially connects the gate electrode 27*a* of the semiconductor chip 27, the gate electrode 28*a* of the semiconductor chip 28, and the connection region 24*d*1 of the circuit pattern 24*d*, which are aligned in a line, so that they are electrically connected to each other.

The bonding wires 29*g* electrically connect the output electrode 25*b* of the semiconductor chip 25, the output electrode 26*b* of the semiconductor chip 26, and the circuit pattern 24*c* in a direction anti-parallel to the connection direction of the bonding wire 29*a*. More specifically, for this connection, the bonding wires 29*g* sequentially connect a plurality of points on the output electrode 25*b* of the semiconductor chip 25, a plurality of points on the output electrode 26*b* of the semiconductor chip 26, and the connection region 24*c*2 of the circuit pattern 24*c*.

The bonding wires 29*h* electrically connect the output electrode 27*b* of the semiconductor chip 27, the output electrode 28*b* of the semiconductor chip 28, and the circuit pattern 24*e* in a direction anti-parallel to the connection direction of the bonding wire 29*b*. More specifically, for this connection, the bonding wires 29*h* sequentially connect a plurality of points on the output electrode 27*b* of the semiconductor chip 27, a plurality of points on the output electrode 28*b* of the semiconductor chip 28, and the connection region 24*e*2 of the circuit pattern 24*e*. In this connection, stitch bonding as described with reference to FIGS. 6A and 6B is performed for these bonding wires 29*g* and 29*h*.

The single bonding wire 29*g*1 electrically connects the output electrode 25*b* of the semiconductor chip 25 and the circuit pattern 24*c* in a direction that is the same as the connection direction of the bonding wires 29*g* and is anti-parallel to the connection direction of the bonding wire 29*a*. More specifically, the single bonding wire 29*g*1 connects a single region 25*b*3 of the output electrode 25*b* of the semiconductor chip 25, indicated by a broken line in FIG. 8, and the connection region 24*c*2 of the circuit pattern 24*c*. The single region 25*b*3 is a region that extends from the gate electrode 25*a* in a direction opposite to the connection direction of the bonding wire 29*a* in the output electrode 25*b* of the semiconductor chip 25 in plan view. That is, the single region 25*b*3 extends from the gate electrode 25*a* toward the extension region 24*c*3 of the circuit pattern 24*c* in the output electrode 25*b* of the semiconductor chip 25. One or more single bonding wires 29*g*1 may be provided for the connection. In this connection, FIG. 8 illustrates the case where one single bonding wire 29*g*1 is provided.

The single bonding wire 29*h*1 electrically connects the output electrode 28*b* of the semiconductor chip 28 and the circuit pattern 24*e* in a direction that is the same as the connection direction of the bonding wires 29*h* and is anti-parallel to the connection direction of the bonding wire 29*b*. More specifically, the single bonding wire 29*h*1 connects a single region 28*b*3 of the output electrode 28*b* of the semiconductor chip 28, indicated by a broken line in FIG. 8, and the connection region 24*e*2 of the circuit pattern 24*e*. The single region 28*b*3 is a region that extends from the gate electrode 28*a* in a direction opposite to the connection direction of the bonding wire 29*b* in the output electrode 28*b* of the semiconductor chip 28 in plan view. That is, the single region 28*b*3 extends from the gate electrode 28*a* toward the circuit pattern 24*e* in the output electrode 28*b* of the semiconductor chip 28. One or more single bonding wires 29*h*1 may be provided for the connection. In this connection, FIG. 8 illustrates the case where one single bonding wire 29*h*1 is provided.

As described above, the semiconductor chips 25 to 28, circuit patterns 24*a* to 24*e*, bonding wires 29*a*, 29*b*, 29*g*, and 29*h*, and single bonding wires 29*g*1 and 29*h*1 form an inverter circuit illustrated in FIG. 5, as in the third embodiment. In the semiconductor unit 40, the semiconductor chips 25 and 26, circuit patterns 24*a* and 24*b*, and bonding wire 29*a* form the first arm part (upper arm part) A. In addition, in the semiconductor unit 40, the semiconductor chips 27 and 28, the circuit patterns 24*c* and 24*d*, and bonding wire 29*b* form the second arm part (lower arm part) B. In addition, the semiconductor unit 40 is connected to an external electrical device, which is externally provided to the semiconductor device 10, by an external connection terminal (not illustrated) formed using a lead frame or the like. The external connection terminal includes a C1 terminal (corresponding to the contact region 24*a*1), an E2 terminal (corresponding to the contact region 24*e*1), and an E1C2 terminal (corresponding to the contact region 24*c*1). Then, the high-potential terminal of an external power supply is connected to the C1 terminal serving as an input P terminal and the low-potential terminal of the external power supply is connected to the E2 terminal serving as an input N terminal. Then, a load (not illustrated) is connected to the E1C2 terminal serving as an output U terminal of the semiconductor unit 40. Thereby, the semiconductor unit 40 functions as an inverter. In the semiconductor unit 40 configured as above, for example, an external connection terminal (not illustrated) may be joined to the contact regions 24*a*1, 24*c*1, and 24*e*1, and the semiconductor chips 25 to 28 and bonding wires 29*a*, 29*b*, 29*g*, and 29*h* on a ceramic circuit substrate 21 may be sealed with a sealing member.

In a semiconductor device 10 including the above semiconductor unit 40, the first arm part (upper arm part) A and the second arm part (lower arm part) B are able to prevent a decrease in gate response speed, as in the third embodiment, and therefore to reduce the possibility of non-uniform current generation. Thereby, it is possible to minimize an increase in temperature when a current flows and also to prevent concentration of heat generation. In addition, it is possible to make the most of the chip mounting areas of the circuit patterns 24*a* and 24*c* for the semiconductor chips 25 to 28 and to thereby increase output current. In addition, in the semiconductor unit 40, the bonding wire 29*a* connected to on the gate electrodes 25*a* and 26*a* of the semiconductor chips 25 and 26 and the bonding wire 29*b* connected to the gate electrodes 27*a* and 28*a* of the semiconductor chips 27 and 28 are in opposite directions. Therefore, in the semiconductor unit 40, the circuit pattern 24*a* and semiconductor chips 25 and 26 and the circuit pattern 24*c* and semiconductor chips 27 and 28 are disposed substantially point symmetrically, and so are the bonding wires 29*a* and 29*b*. This minimizes an imbalance of heat generation when a current flows in the semiconductor unit 40. Thus, it is possible to prevent occurrence of a failure and others due to the imbalance of heat generation in the semiconductor unit 40.

In addition, in the semiconductor unit 40, the semiconductor chips 25 and 26 are disposed such that the gate electrodes 25*a* and 26*a* face the connection direction of the bonding wire 29*a* and also face opposite to the connection direction of the bonding wires 29*g*. The gate electrodes 25*a* and 26*a* and the connection region 24*b*1 of the circuit pattern 24*b* are connected linearly by the bonding wire 29*a*. In this case, the bonding wire 29*a* is shorter than the bonding wire 29*a* (FIG. 7) of the semiconductor unit 30 of the third embodiment. Similarly, the bonding wire 29*b* is shorter than the bonding wire 29*b* (FIG. 7) of the semiconductor unit 30 of the third embodiment. Therefore, the highest position of the bonding wires 29*a* and 29*b* with respect to the front surface of the ceramic circuit substrate 21 is lower than in the semiconductor unit 30. Therefore, while the semiconductor unit 40 is manufactured, the bonding wires 29*a* and 29*b* are unlikely touched mechanically and artificially during processing. As a result, contacts of the bonding wires 29*a* and 29*b* to the bonding wires 29*g* and 29*h* are avoided and short circuits caused by the contacts of the bonding wires 29*a* and 29*b* to the bonding wires 29*g* and 29*h* are prevented.

The disclosed techniques make it possible to increase output current by making the most of a chip mounting area for semiconductor chips while preventing a decrease in gate response speed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising a semiconductor unit, including:

a first arm part that includes a first semiconductor chip having a first main electrode, a second semiconductor chip having a second main electrode, a first circuit pattern on which the first semiconductor chip and the second semiconductor chip are disposed, a second circuit pattern to which the first main electrode and the second main electrode are connected, a first main current wire extending in a first direction and connecting a plurality of points of the first main electrode, and the second circuit pattern, by stitch bonding, and a second main current wire extending in the first direction and connecting a plurality of points of the second main electrode, and the second circuit pattern, by the stitch bonding; and a second arm part that includes a third semiconductor chip having a third main electrode and being disposed on the second circuit pattern, a fourth semiconductor chip having a fourth main electrode and being disposed on the second circuit pattern, a third circuit pattern to which the third main electrode and the fourth main electrode are connected, a third main current wire extending in the first direction and connecting a plurality of points of the third main electrode, and the third circuit pattern, by the stitch bonding, and a fourth main current wire extending in the first direction and connecting a plurality of points of the fourth main electrode, and the third circuit pattern, by the stitch bonding, wherein each of the first to fourth semiconductor chips is an insulated gate bipolar transistor (IGBT) or a metal-oxide-semiconductor field-effect transistor (MOSFET) that has a diode region functioning as a diode.

2. The semiconductor device according to claim 1, wherein the first semiconductor chip and the second semiconductor chip are aligned in a second direction in a plan view of the semiconductor device, and the third semiconductor chip and the fourth semiconductor chip are aligned in the second direction in the plan view.

3. The semiconductor device according to claim 2, wherein the first direction is perpendicular to the second direction in the plan view.

4. The semiconductor device according to claim 3, wherein the first main current wire directly connects the plurality of points of the first main electrode, and the second circuit pattern, by the stitch bonding, the second main current wire directly connects the plurality of points of the second main electrode, and the second circuit pattern, by the stitch bonding, the third main current wire directly connects the plurality of points of the third main electrode, and the third circuit pattern, by the stitch bonding, and the fourth main current wire directly connects the plurality of points of the fourth main electrode, and the third circuit pattern, by the stitch bonding.

5. The semiconductor device according to claim 2, wherein the second direction is parallel to the first direction.

6. The semiconductor device according to claim 5, wherein the first main current wire connects the plurality of points of the first main electrode, another plurality of points of the second main electrode, and the second circuit pattern, by the stitch bonding, the second main current wire connects another plurality of points of the first main electrode, the plurality of points of the second main electrode, and the second circuit pattern, by the stitch bonding, the third main current wire connects the plurality of points of the third main electrode, another plurality of points of the fourth main electrode, and the third circuit pattern, by the stitch bonding, the fourth main current wire connects another plurality of points of the third main electrode, the plurality of points of the fourth main electrode, and the third circuit pattern, by the stitch bonding.

7. The semiconductor device according to claim 5, wherein the first arm part further includes a fifth main current wire connecting a single point of the first main electrode and the second circuit pattern, and the second arm part further includes a sixth main current wire connecting a single point of the third main electrode and the third circuit pattern.

8. The semiconductor device according to claim 1, wherein the first semiconductor chip further has a first control electrode, the second semiconductor chip further has a second control electrode, the third semiconductor chip further has a third control electrode, and the fourth semiconductor chip further has a fourth control electrode.

9. The semiconductor device according to claim 8, further comprising a plurality of control wires extending in a second direction perpendicular to the first direction in a plan view of the semiconductor device, the plurality of control wires being respectively connected to the first control electrode, the second control electrode, the third control electrode, and the fourth control electrode.

10. The semiconductor device according to claim 8, further comprising a plurality of control wires extending in the first direction in a plan view of the semiconductor device, the plurality of control wires being respectively connected to the first control electrode, the second control electrode, the third control electrode, and the fourth control electrode.

11. The semiconductor device according to claim 1, wherein the first semiconductor chip, the second semiconductor chip, the third semiconductor chip, and the fourth semiconductor chip are each approximately square in a plan view of the semiconductor device.

12. The semiconductor device according to claim 1, wherein the diode region serves as a Schottky barrier diode (SBD).

13. The semiconductor device according to claim 1, wherein each of the first semiconductor chip, the second semiconductor chip, the third semiconductor chip, and the fourth semiconductor chip is a reverse-conducting insulated gate bipolar transistor (RC-IGBT) chip.

14. The semiconductor device according to claim 1, wherein each of the first semiconductor chip, the second semiconductor chip, the third semiconductor chip, and the fourth semiconductor chip is a silicon carbide (SiC) chip.

15. The semiconductor device according to claim 13, wherein the RC-IGBT chip includes an IGBT region and a free-wheeling diode (FWD) region, and the plurality of points of the RC-IGBT chip are on a border between the FWD region and the IGBT region.

16. The semiconductor device according to claim 15, wherein the FWD region and the IGBT region are repeatedly and alternately arranged in a second direction perpendicular to the first direction in a plan view of the semiconductor device.

17. The semiconductor device according to claim 15, wherein the FWD region and the IGBT region are repeatedly and alternately arranged in the first direction in a plan view of the semiconductor device.

18. The semiconductor device according to claim 1, wherein the semiconductor unit is provided in plurality, and the plurality of semiconductor units are aligned in a second direction perpendicular to the first direction in a plan view of the semiconductor device.

19. A semiconductor device, comprising a semiconductor unit, including:

a first arm part that includes a first semiconductor chip having a first main electrode, a second semiconductor chip having a second main electrode, a first circuit pattern on which the first semiconductor chip and the second semiconductor chip are disposed, a second circuit pattern to which the first main electrode and the second main electrode are connected, a first main current wire extending in a first direction and connecting the first main electrode and the second circuit pattern, and a second main current wire extending in the first direction and connecting the second main electrode and the second circuit pattern; and a second arm part that includes a third semiconductor chip having a third main electrode and being disposed on the second circuit pattern, a fourth semiconductor chip having a fourth main electrode and being disposed on the second circuit pattern, a third circuit pattern to which the third main electrode and the fourth main electrode are connected, a third main current wire extending in the first direction and connecting the third main electrode and the third circuit pattern, and a fourth main current wire extending in the first direction and connecting the fourth main electrode and the third circuit pattern, wherein each of the first to fourth semiconductor chips is a reverse conducting-insulated gate bipolar transistor (RC-IGBT).

20. A semiconductor device, comprising a semiconductor unit, including:

a first arm part that includes a first semiconductor chip having a first main electrode, a first circuit pattern on which the first semiconductor chip is disposed, a second circuit pattern to which the first main electrode is connected, and a first main current wire extending in a first direction and connecting a plurality of points of the first main electrode, and the second circuit pattern, by stitch bonding; and a second arm part that includes a second semiconductor chip having a second main electrode and being disposed on the second circuit pattern, a third circuit pattern to which the second main electrode is connected, and a second main current wire extending in the first direction and connecting a plurality of points of the second main electrode, and the third circuit pattern, by stitch bonding, wherein each of the first and second semiconductor chips is a reverse conducting-insulated gate bipolar transistor (RC-IGBT).

* * * * *